(12) United States Patent
Figueira

(10) Patent No.: US 6,609,226 B1
(45) Date of Patent: Aug. 19, 2003

(54) NETWORKING DEVICE AND METHOD FOR MAKING CYCLIC REDUNDANCY CHECK (CRC) IMMUNE TO SCRAMBLER ERROR DUPLICATION

(75) Inventor: Norival R. Figueira, San Jose, CA (US)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/545,660

(22) Filed: Apr. 10, 2000

(51) Int. Cl.[7] ............................................. H03M 13/09
(52) U.S. Cl. ...................................................... 714/807
(58) Field of Search ................................. 714/798, 807

(56) References Cited

U.S. PATENT DOCUMENTS

| | | | | |
|---|---|---|---|---|
| 5,321,754 A | * | 6/1994 | Fisher et al. ................ | 375/367 |
| 5,703,882 A | * | 12/1997 | Jung et al. .................. | 370/474 |
| 5,923,680 A | * | 7/1999 | Brueckheimer et al. .... | 714/758 |
| 6,002,675 A | | 12/1999 | Ben-Michael et al. ...... | 370/315 |
| 6,061,449 A | | 5/2000 | Candelore et al. ............ | 380/28 |
| 6,349,138 B1 | * | 2/2002 | Doshi et al. ................. | 380/200 |

OTHER PUBLICATIONS

Dravida, "Eror Conrol Aspects of High Speed Networks", INFOCOM '92, 1992, pp. 272–281.*

* cited by examiner

Primary Examiner—Stephen M. Baker
(74) Attorney, Agent, or Firm—Blakely Sokoloff Taylor & Zafman LLP (57) ABSTRACT

A networking device and method for transparently modifying a cyclic redundancy check (CRC) of a message so that higher layers (e.g., data link layer and above) can detect error duplication caused by scrambling and descrambling. No increase in the size of the messaging is needed so that the invention may be used for current and future technologies. In one embodiment, the networking device comprises logic employed within a physical layer of the device. This logic, referred to as a scrambler, modifies an original cyclic redundancy check (CRC) value associated with a message. This enables detection of a duplication of bit errors at a targeted destination of the message.

19 Claims, 7 Drawing Sheets

NETWORKING DEVICE AND METHOD FOR MAKING CYCLIC REDUNDANCY CHECK (CRC) IMMUNE TO SCRAMBLER ERROR DUPLICATION

BACKGROUND

1. Field

The present invention relates to the field of data communications. In particular, this invention relates to a networking device and method for maintaining error detection functionality in the presence of error duplication.

2. General Background

Over the last few years, self-synchronous scramblers have been used in various types of networks in efforts to improve the security of data being transferred between a source and a destination. Currently, self-synchronous scramblers may be used in a synchronous optical network (e.g., Point-to-Point "PPP" over Synchronous Digital Hierarchy "SDH"/Synchronous Optical Network "SONET"), in an Asynchronous Transfer Mode (ATM) based network, or even in an Ethernet network. A scrambler is considered to be "self-synchronous" when the scrambled data transferred to the destination includes the state of the scrambler.

At the destination, a descrambler receives the scrambled data and attempts to recover the original, descrambled data. Unfortunately, in the recovery process, a descrambler duplicates the received bit errors. In certain situations, this may adversely effect error detection capabilities such as the reliability of Ethernet cyclic redundancy check (CRC) operations for example. An Ethernet CRC can detect 1-, 2-, or 3-bit errors for any burst error with a length up to thirty-two (32) bits. However, due to error duplication by the descrambler, the burst error may greatly exceed 32 bits.

Figure 1:
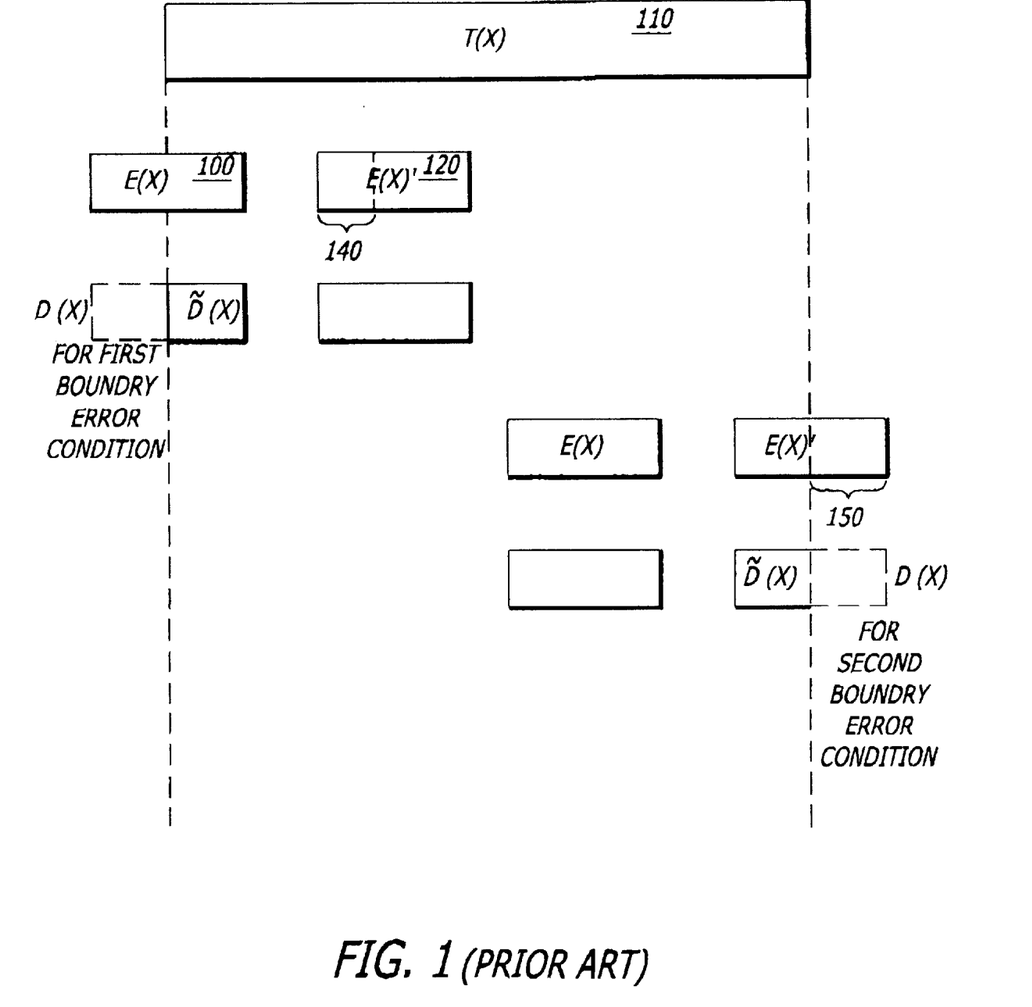
FIG. 1 is an illustrative embodiment of a first boundary error condition and a second boundary error condition experienced during the transmission of a message.

Although it has been shown that the reduction in the error detection capability of the Ethernet CRC is negligible for random errors, the error duplication of the descrambler causes certain normally detectable errors to become undetectable and vice versa. For example, as shown in FIG. 1, "E(x)" 100 is a polynomial representation of the error on the received bit stream before descrambling, "T(x)" 110 is a polynomial representation of a transmitted message, "E'(x)" 120 is a polynomial representation of the duplication of the error E(x), and "D(x)" 130 is a polynomial representation of the error, E(x)+E'(x), realized at the destination after descrambling. As shown, for a first boundary error condition, bit errors 140 occurring outside T(x) 110 are now duplicated inside T(x) 110. Likewise, for a second boundary error condition, bit errors occurring inside T(x) 150 are duplicated and now are partially outside T(x) 110. Thus, error detection in the presence of the scrambler may become less reliable. Of course, when D(x) 130 is entirely contained in T(x) 110, the error detection capabilities of CRC are not comprised when the CRC and the scrambler polynomials have no factors in common.

SUMMARY

The present invention relates to a networking device and method for transparently modifying a cyclic redundancy check (CRC) of a message so that higher layers (e.g., data link layer and above) can detect error duplication caused by scrambling and descrambling. No increase in the size of the messaging is needed so that the invention may be used for current and future technologies. In one embodiment, the networking device comprises logic employed within a physical layer of the device. This logic, referred to as a scrambler, modifies an original cyclic redundancy check (CRC) value associated with a message. This enables detection of a duplication of bit errors at a targeted destination of the message.

BRIEF DESCRIPTION OF THE DRAWINGS

The features and advantages of the present invention will become apparent from the following detailed description of the present invention in which.

DETAILED DESCRIPTION

Embodiments of the present invention relate to a networking device and method for maintaining error detection functionality in the presence of error duplication without message modifications. Herein, in one embodiment, error detection functionality is maintained by including bit errors occurring up to N bits before the beginning of a transmitted message and/or after the ending of the transmitted message in cyclic redundancy check (CRC) calculations.

Herein, certain terminology is used to describe various features of the present invention. In general, a "network" comprises one or more networking devices in communication with each other over a link. A "networking device" comprises hardware and/or software used to transfer information to a selected destination. Examples of a networking device include a router, a switch, a repeater, a computer (e.g., server, desktop, laptop, hand held, etc.), set-top box, or any device operating as a gateway for outgoing or incoming data. The networking device includes logic such as hardware and/or software (e.g., a program being code performing certain functionality when processed) employed within the physical layer. This hardware and/or software may include a scrambler that rearranges information before transmission and/or a descrambler that rearranges incoming information back to its original, unscrambled format. A "link" is a connection between two networking devices that supports the transmission or reception of information over a selected medium such as, for example, Plain Old Telephone System (POTS) lines, twisted pair, optical fiber, or wireless (e.g., satellite, radio frequency, infrared, etc.). Of course, other link types may be considered without departing from the spirit and scope of the invention.

"Information" generally comprises one or more signals having one or more bits of data, address, control or any combination thereof transmitted in accordance with any chosen messaging scheme. A "message" is a selected grouping of information. For example, the message may be packet based and include a routing field (e.g., destination address, and/or source address, type or length, etc.), a data field (e.g., data, padding, etc.) and a frame check sequence (FCS) field. The FCS field includes the cyclic redundancy check (CRC) value, which is computed from at least a portion of the contents of the routing and data fields. An Ethernet frame would constitute a particular packet-based message. The term "CRC[]" indicates a CRC operation performed on the contents of a bit stream such as any transmitted message including an Ethernet frame.

I. General Overall Architecture

Figures 2, 3:
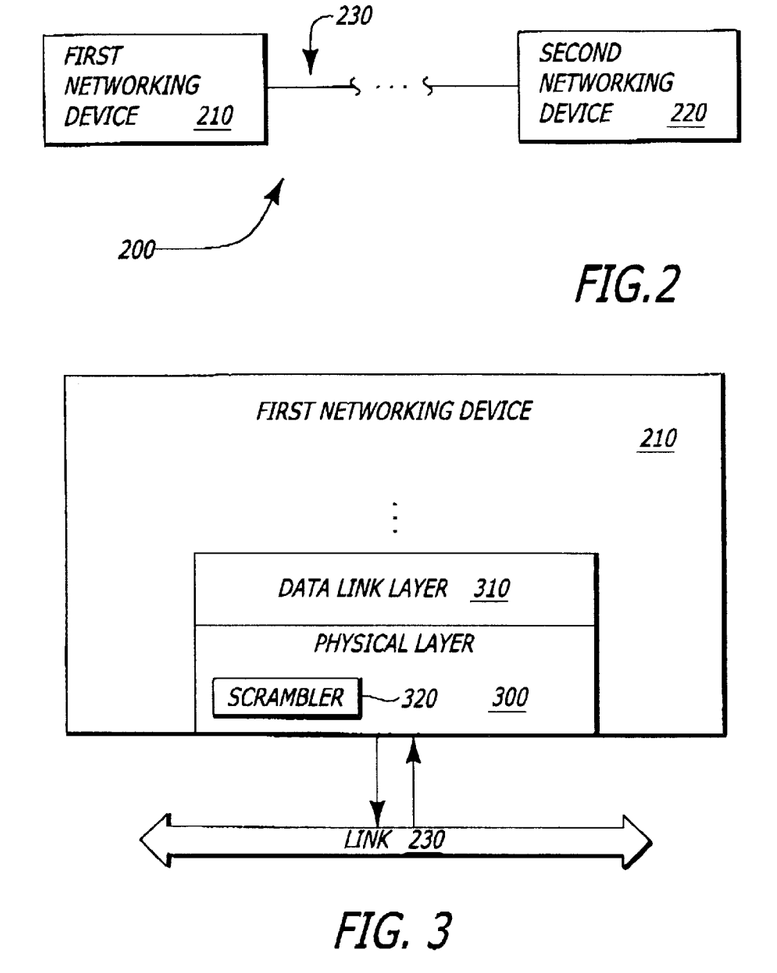
FIG. 2 is an illustrative embodiment of a network utilizing the present invention.
FIG. 3 is an illustrative embodiment of a networking device implemented in the network of FIG. 2.

Referring to FIG. 2, an illustrative embodiment of a network 200 utilizing the invention is shown. Herein, the network 200 comprises a first networking device (transmitter) 210 in communication with a second networking device (receiver) 220. The communication is established by one or more links 230. The network 200 may be an Ethernet where links 230 support transmission rates of either 10 Megabit per second (Mbps), 100 Mbps, 1 Gigabit per second (Gbps), 10 Gbps and even faster transmission rates. Of course, the network 200 may be non-Ethernet based.

II. Network Embodiment

A. Networking Device with $X^N+1$ Scrambler

Referring now to FIG. 3, an illustrative embodiment of the first networking device 210 is shown. The first networking device 210 is configured in accordance with Open System Interconnection (OSI) and includes a physical layer 300 and a data link layer 310. More specifically, the physical layer 300 handles data transmissions over links 230 while the data link layer 310 groups the data, performs error correction and detection, and controls the flow of data over link 230. For this invention, a scrambler 320 is employed within the physical layer 300 and is configured in accordance with any selected derivation of polynomial representation "S(x)" as set forth in equation (1), provided that it has no factors in common with a CRC generation polynomial "G(x)" described below.

$$S(x)=x^N+1 \quad (1)$$

B. Error Detection

Figure 4:
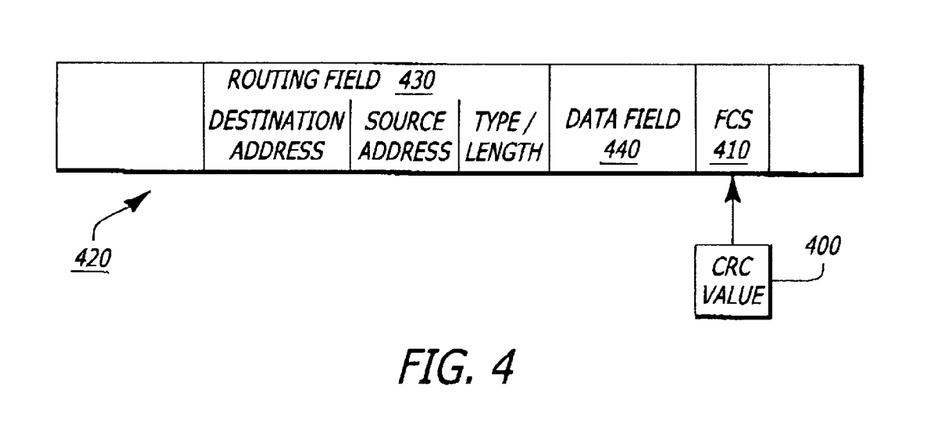
FIG. 4 is an illustrative embodiment of a data structure of a transmitted message such as an Ethernet frame.

Error detection is a technique used to determine whether the transmission of data occurred without any errors. One error detection technique uses a standard cyclic redundancy check (CRC) function. Prior to transmission, the CRC function modifies a transmitted message so that it is always divisible (modulo 2) by a predetermined CRC polynomial at the second networking (receiver) device. As shown in FIG. 4, the CRC function is used to generate an i-bit CRC value 400 (e.g., "i" is a positive whole number) for insertion into a field (e.g., FCS field) 410 of a transmitted message 420 (e.g., an Ethernet frame). The CRC value 400 is computed based on the contents of at least a routing field 430 (e.g., a destination address) and a data field 440, namely for the routing field 430 through the end of the data field 440, inclusive. The encoding by the CRC value is defined by G(x) where "$b_i$" is either a "0" (representing that no term is present) or a "1" (representing that a term is present).

$$G(x)=x^i+(b_{i-1})x^{i-1}+(b_{i-2})x^{i-2}+\ldots+b_1x+1 \quad (2)$$

Figure 5:
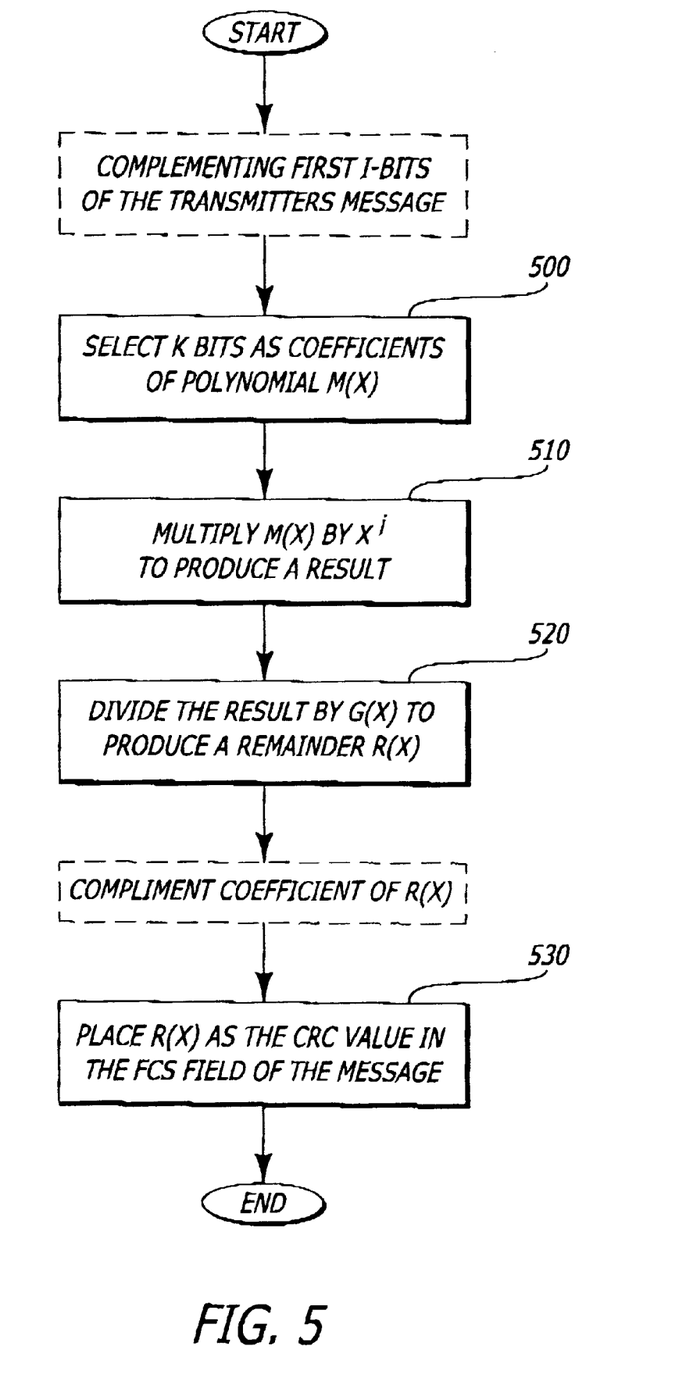
FIG. 5 is an illustrative embodiment of a flowchart featuring the operations performed to generate a CRC value.

More specifically, as shown in a flowchart of FIG. 5, the CRC value corresponding to a transmitted message is computed by selecting a predetermined number of bits (K) from the transmitted message as coefficients for a polynomial M(x) of degree K−1 (block 500). Of course, for the Ethernet frame however, most significant i-bits of the Ethernet frame may be complemented prior to selecting the K bits. M(x) is multiplied by $x^i$ (e.g., to perform a 32-bit shift to the left when i=32) as set forth in block 510. Then, the result $M(x)x^i$ is divided by G(x), which produces a remainder R(x) having a degree less than or equal to i−1 (block 520). This bit sequence (R(x)) may be complemented for Ethernet and the result producing the CRC value. Alternatively, the coefficients of R(x) are collectively considered to be an i-bit sequence and constitute the CRC value. The CRC value is placed in the FCS field so that the $x^{i-1}$ term is the most significant bit of the first octet, and the $x^0$ term is the least significant bit of the last octet (block 530). The transmitted message T(x) is equivalent to modulo 2 addition of $M(x)x^i$ and FCS. It is appreciated that "modulo 2 addition" is the same as modulo 2 subtraction, which is the same as an Exclusive-OR (XOR) of the corresponding bit patterns.

C. Self-Synchronous Scrambler/Descrambler

Figure 6:
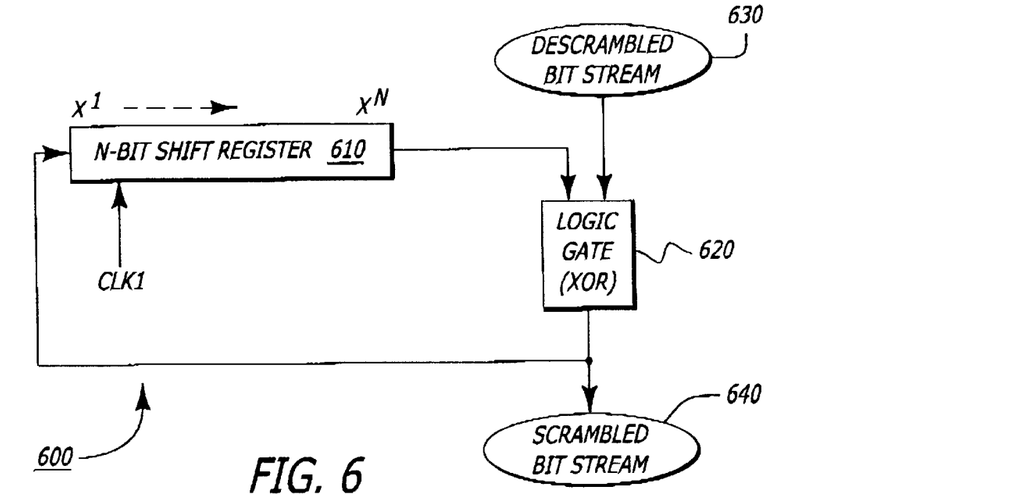
FIG. 6 is an illustrative embodiment of the operations of a self-synchronous scrambler implemented in a physical layer of a networking device.
Figure 7:
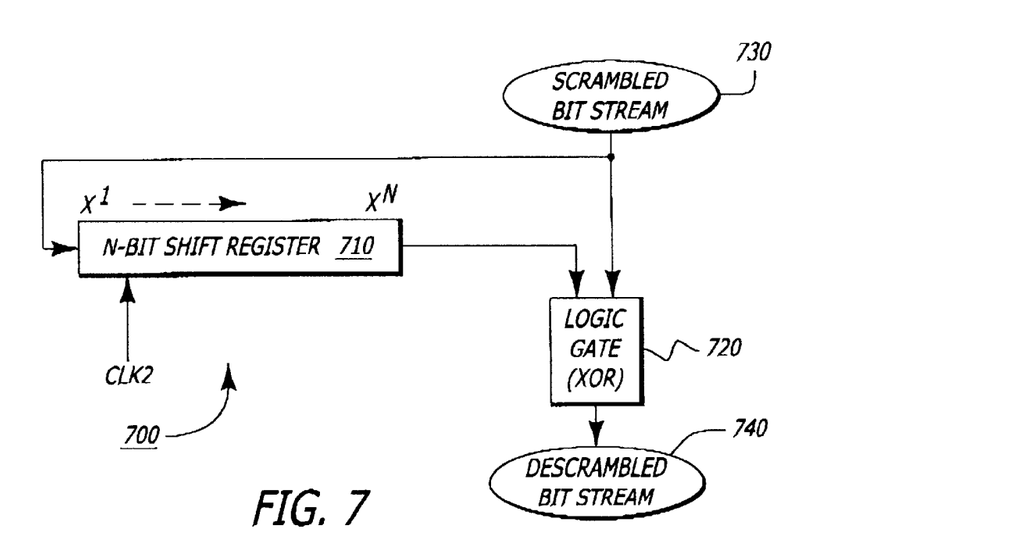
FIG. 7 is an illustrative embodiment of the operations of a self-synchronous descrambler, implemented in a physical layer of a networking device.

Referring now to FIGS. 6 and 7, an illustrative embodiment of the operations of a self-synchronous scrambler and descrambler implemented in a physical layer of a networking device is shown. For clarity sake, the representative polynomial for the self-synchronous scrambler and descrambler is $x^N+1$. Thus, at any given time, the state of the scrambler/descrambler is the contents of the respective N-bit shift register.

Referring to FIG. 6, a scrambler 600 includes an N-bit shift register 610 clocked by a clocking signal (CLK1). At each CLK1 cycle, a most significant bit of the shift register 610 is loaded into a first input of a logic gate 620 (e.g., Exclusive-OR "XOR"). Concurrently, a bit of a descrambled bit stream 630 is loaded into a second input of the logic gate 620, which produces a bit of a scrambled bit stream 640. This bit is also fed back as a least significant bit of the shift register 610 for subsequent scrambling operations.

It is noted that the scrambler 600 can be initially set to any arbitrary value. For security purposes, the initial state of the scrambler 600 is usually set to a random value. The initial descrambler state is irrelevant because it will acquire the correct state from the scrambled data stream. The first N descrambled bits (e.g., for an $x^N+1$ descrambler) will be wrong because the descrambler is still collecting the correct state.

Figure 8:
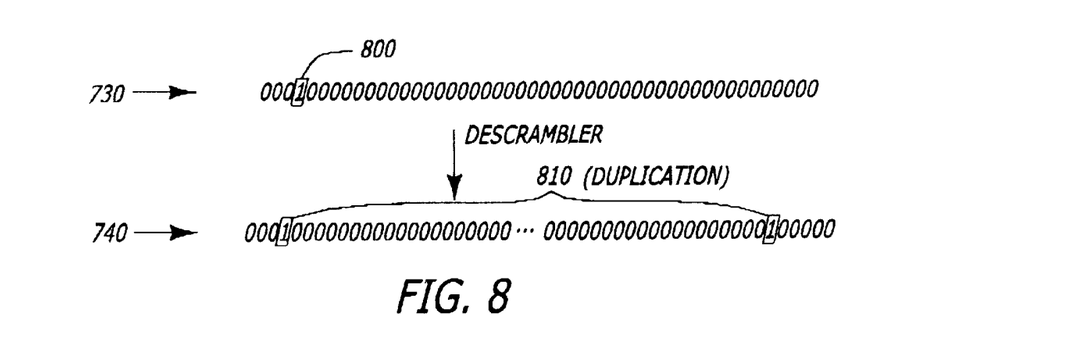
FIG. 8 is an illustrative embodiment of the duplication of bit errors for a self-synchronous $x^N+1$ descrambler.

Referring now to FIG. 7, a descrambler 700 corresponding to $x^N+1$ scrambler 600 includes an N-bit shift register 710 clocked by a clocking signal (CLK2), which may differ from the clock frequency of CLK1. At each CLK2 cycle, a most significant bit of the shift register 710 is loaded into a first input of logic gate 720 (e.g., exclusive-OR "XOR"). Concurrently, a bit of a scrambled bit stream 730 is loaded into a second input of the logic gate 720 and as a least significant bit of the shift register 710 for subsequent descrambling operations to produce a descrambled bit stream 740. Thus, bit errors are duplicated N-bits later. For example, as shown in FIG. 8, a single bit error 800 descrambled by the $x^N+1$ descrambler 700 of FIG. 7 produces a double bit error 810 where the bit errors are separated by N−1 zeros.

D. Techniques to Maintain Error Detection Functionality

As described below, two techniques have been developed to avoid inaccurate error detection caused by boundary error conditions without increasing the message framing size by even a single bit. These techniques may be performed either separately to correct a specific boundary error condition or collectively to eliminate the effects of error duplication without increasing the size of the message or changing its format. The first technique overcomes the first boundary error condition by extending the reach of the CRC calculation to cover all the bit errors occurring up to N bits before the beginning of a transmitted message T(x) when employing a scrambler configured in accordance with a polynomial S(x) of degree N (e.g., a $x^N+1$ scrambler). This makes the error $\tilde{D}(x)$, detectable when D(x) is detectable when using standard CRC calculations. The second technique overcomes the second boundary error condition by extending the reach of the CRC calculation to include any error duplication that spans beyond T(x) in order to eliminate problems caused by error duplication outside T(x).

(1) Overcoming the First Boundary Error Condition

Figure 9:
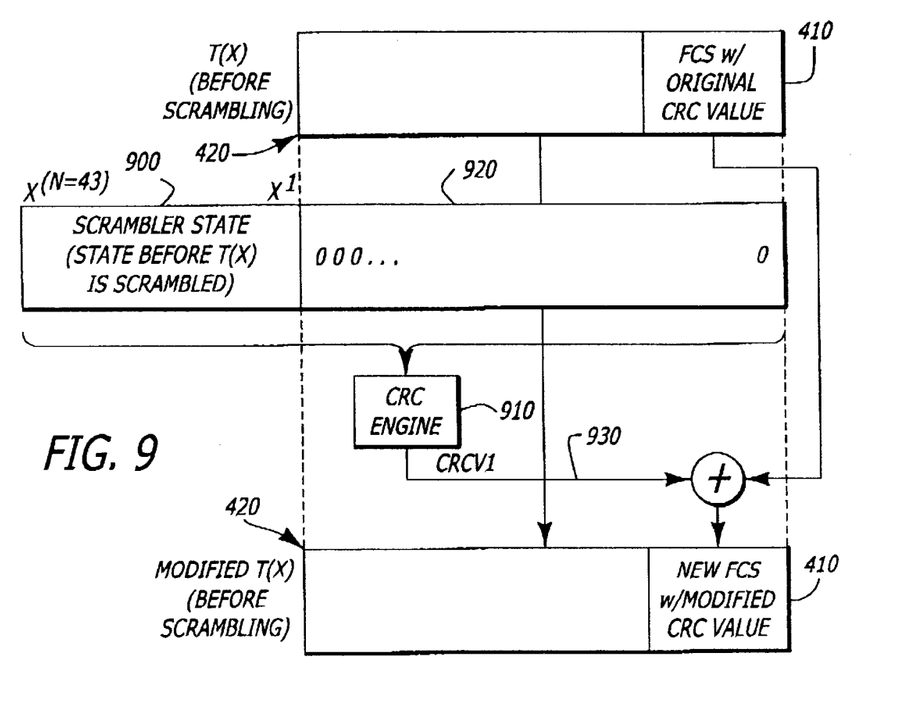
FIG. 9 is an illustrative embodiment of the operations of a self-synchronous scrambler of FIG. 6 to correct for bit error duplication caused by a first boundary error condition.
Figure 10:
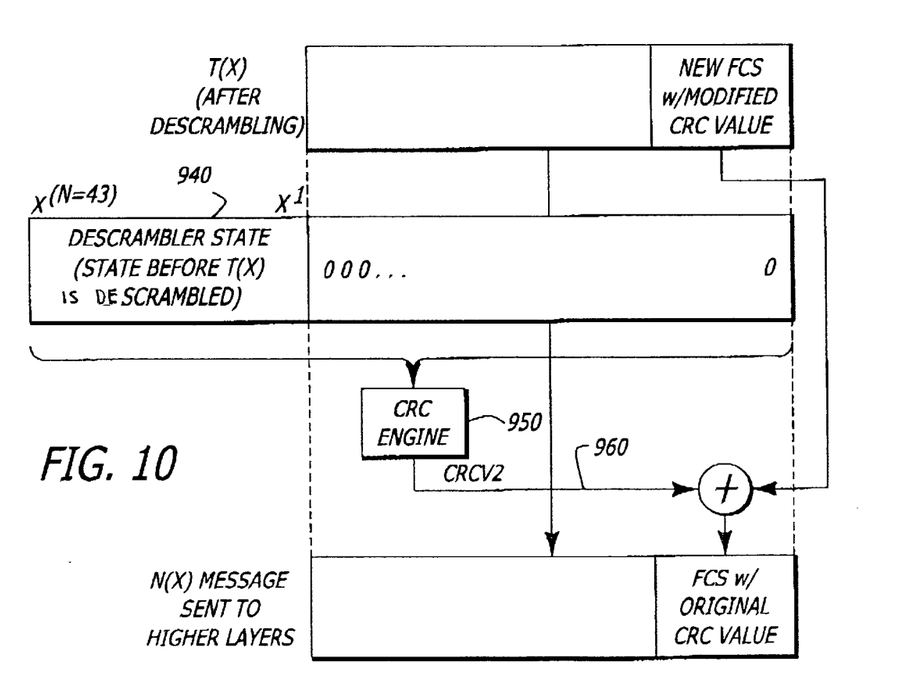
FIG. 10 is an illustrative embodiment of the operations of a self-synchronous descrambler of FIG. 7 to correct for bit error duplication caused by the first boundary error condition.

Referring now to FIGS. 9 and 10, a first technique for extending the reach of the CRC calculation to cover all bit errors occurring up to N bits before the beginning of the transmitted message T(x) 420 of FIG. 4 is shown, provided the $x^N+1$ scrambler is used. For clarity sake, the scrambler is illustrated as a $x^{43}+1$ scrambler (where N=43).

At the physical layer of the first networking device, a state 900 of the scrambler at the moment the first bit of T(x) 420 is about to be scrambled is loaded into a CRC engine 910. The CRC engine 910 is initialized prior to receiving the first input bit. After scrambler state 900 has been loaded, a number of zero bits 920 equal to the number of bits contained in T(x) 420 is loaded into the CRC engine 910. The bit sequence formed by the scrambler state (bits $x^N$ to $x^1$ in this order) followed by the zero bits 920 which are equal to the length of T(x) is taken as the coefficients of a polynomial M(x). This polynomial M(x) is then used by the CRC engine 910 to calculate a resulting CRC value 930 (labeled "CRCV1") as described in FIG. 5. Thereafter, resulting CRC value 930 undergoes arithmetic operations (e.g., modulo 2 addition) with contents of the FCS field 410 to produce a modified CRC value. This "modified CRC value" is placed subsequently in the FCS field 410 of T(x) 420. This entire operation prefers a delay of at least four octets before transmission to allow the addition of the resulting CRC value 930 to the contents of the FCS field 410.

As shown in FIG. 10, at the second networking (receiver) device, the same operations as described above are performed, except for using as input to a CRC engine 950 a state 940 of the descrambler (e.g., the contents of the N-bit shift register from bits $x^N$–$x^1$) immediately before the first bit of T(x) 420 is descrambled. This bit sequence acts as the coefficients of a polynomial M(x) as described in FIG. 5. The resultant CRC value 960 (labeled "CRCV2") undergoes arithmetic operations (e.g., modulo 2 addition) with the contents of the FCS field 410 of T(x) 420 recovered after descrambling.

If there are no transmission errors, the content of the FCS field 410 is restored from its modified CRC value to its original CRC value because the scrambler and descrambler states 900 and 940 are identical at the first and second networking devices immediately before the first bit of the message is scrambled/descrambled. However, if there are transmission errors, the CRC value of the received message (referred to as "N(x)") is equivalent to the CRC value of the error realized at the second networking device (referred to as "D(x)") as shown in the derivation of equation (3). If the error message E(x) is detectable by the CRC, then the error message after the error duplication of the descrambler is also detectable.

$$N(x)=T(x)+I_L(x)+\tilde{D}(x)+I_T(x),$$

where

"+" denotes modulo two addition where $I_L(X)+I_L(X)=0$,

T(x) is the original message received at the physical layer of the first networking (transmitter) device, $I_L(X)$ is the resulting CRC value (930), $\tilde{D}(x)=E_i+E'(x)$ is the error message after descrambling (where $E_i(x)$ is part of E(x) inside T(x), $I_T(x)$ is the resultant CRC value (960), and $I_T(x)=I_L(x)+CRC[E_o(x)]$ where $E_o(x)$ is the error message in the descrambler state at the second networking (receiver) device.

Thus, the CRC value of the received message (CRC[N(x)]) is equivalent to the CRC value of the error realized at the second networking device (CRC[D(x)]) as shown below:

$$N(x)=T(x)+\tilde{D}(x)+CRC[E_o(x)]$$

Figure 11:
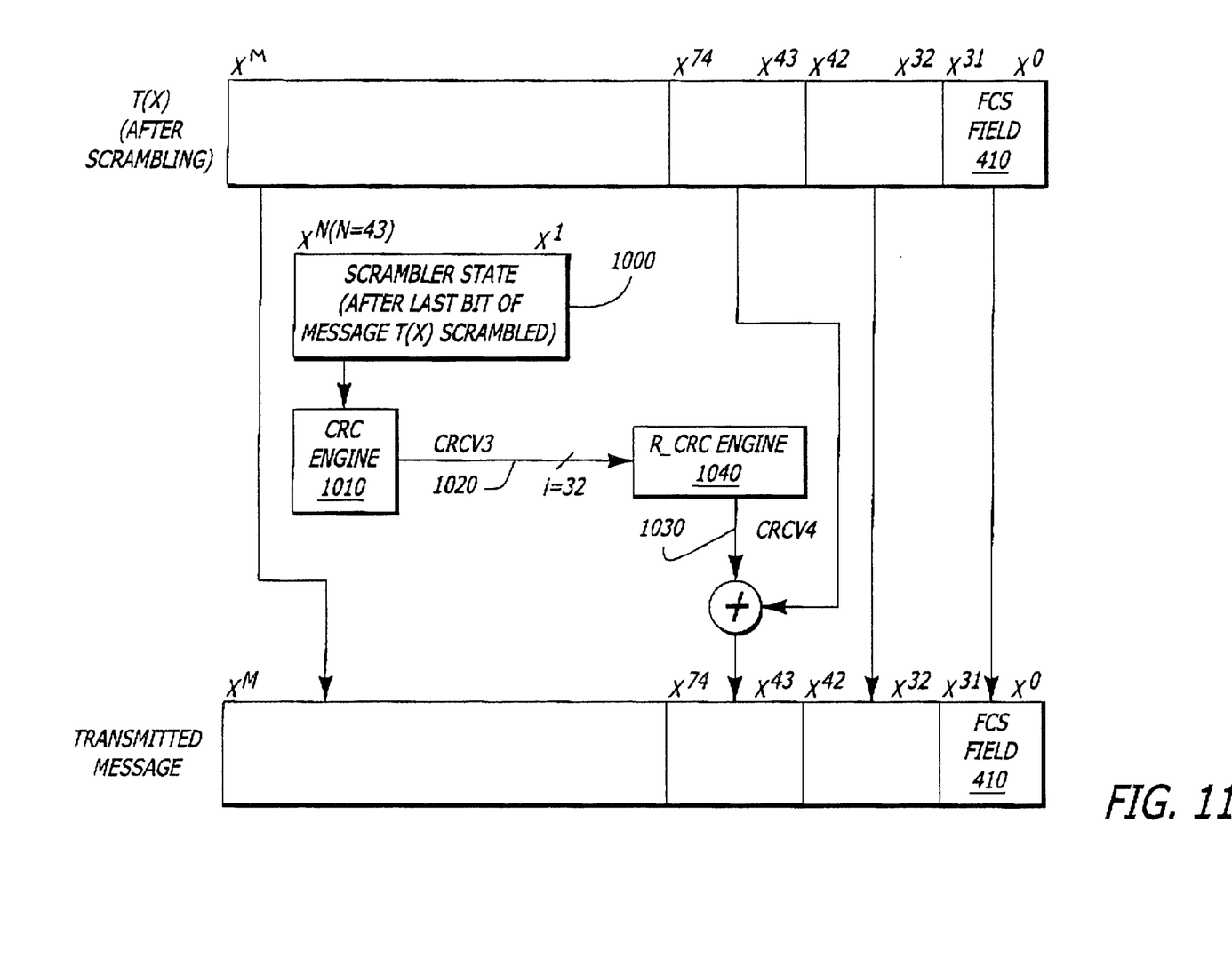
FIG. 11 is an illustrative embodiment of the operations of a self-synchronous scrambler of FIG. 6 to correct for bit error duplication caused by a second boundary error condition.
Figure 12:
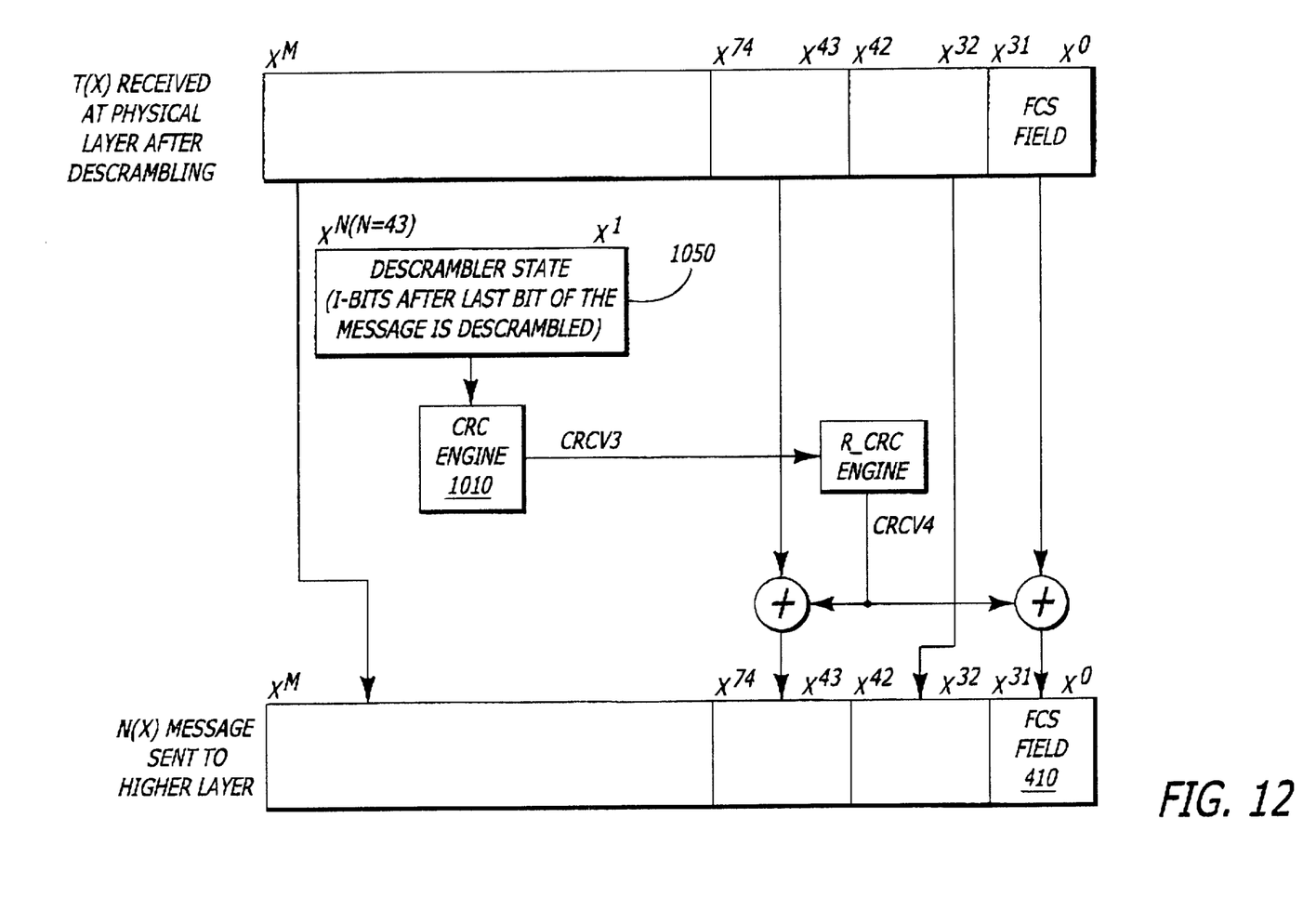
FIG. 12 is an illustrative embodiment of the operations of a self-synchronous descrambler of FIG. 7 to correct for bit error duplication caused by the second boundary error condition.

$CRC[N(x)]=CRC[T(x)]+CRC[\tilde{D}(x)]+CRC[E_o(x)]$, since $CRC[CRC[E_o(x)]]=CRC[E_o(x)]$ $CRC[N(x)]=CRC[\tilde{D}(x)+E_o(x)]$, since $CRC[T(x)]=0$ $=CRC[E_i(x)+E'(x)+E_o(x)]$ $=CRC[E(x)+E'(x)]$ $=CRC[D(x)]$ (2) Overcoming the Second Boundary Error Condition Referring now to FIGS. 11 and 12, a second technique for overcoming the second boundary error condition by extending the reach of the CRC calculation to cover any bit error duplication that exceeds T(x) by a selected number (M) of bits is shown, provided the scrambler is configured in accordance with a selected polynomial representation S(x) of degree N. For clarity, the operations for the second technique are based on the use of a $x^{43}+1$ scrambler.

At the physical layer of the first networking device, a scrambler state 1000 (immediately after the last bit of T(x) 420 is scrambled) is loaded into an initialized CRC engine 1010. After the last bit is processed by the CRC engine 1010, the resulting CRC value (labeled "CRCV3") 1020 is used to calculate an i-bit sequence (labeled "CRCV4") 1030 that is added modulo 2 to bits $x^{43+i-1}$ to $x^{43}$ of T(x) 420 after scrambling. CRCV4 1030 is selected so that modifications to bits $x^{43+i-1}$ to $x^{43}$ (e.g., $x^{74}$–$x^{43}$ for a 32-bit CRC value i=32) are reproduced in the FCS field 410 of the transmitted message T(x) after descrambling at the second networking device.

The i-bit sequence CRCV4 1030 is calculated such that the CRC value of the bit pattern obtained by extending CRCV4 and its duplication (labeled "CRCV4 ($X^{43}+1$)") to the right with 43 zero bits is equal to the CRCV3 1020, that is:

$$CRC[CRCV4(x^{43}+1)x^{43}]=CRCV3 \quad (4)$$

Thus, the R—CRC engine 1040 produces CRCV4 1030 and operates as an inverse function to the operations set forth in equation (4). A table listing the CRCV3 and corresponding CRCV4 values for a $x^{43}+1$ scrambler is shown below.

| CRCV3 (hex) | | CRCV4 (hex) | |
|---|---|---|---|
| 0000 | 0001 | F3A7 | 749C |
| 0000 | 0002 | E38F | F48F |
| 0000 | 0004 | C3DE | F4A9 |
| 0000 | 0008 | 837C | F4E5 |
| 0000 | 0010 | 0238 | F47D |
| 0000 | 0020 | 0471 | E8FA |
| 0000 | 0040 | 08E3 | D1F4 |
| 0000 | 0080 | 11C7 | A3E8 |
| 0000 | 0100 | 238F | 47D0 |
| 0000 | 0200 | 471E | 8FA0 |
| 0000 | 0400 | 8E3D | 1F40 |
| 0000 | 0800 | 18BB | 2337 |
| 0000 | 1000 | 3176 | 466E |
| 0000 | 2000 | 62EC | 8CDC |
| 0000 | 4000 | C5D9 | 19B8 |
| 0000 | 8000 | 8F73 | 2EC7 |
| 0001 | 0000 | 1A27 | 4039 |
| 0002 | 0000 | 344E | 8072 |
| 0004 | 0000 | 689D | 00E4 |
| 0008 | 0000 | D13A | 01C8 |
| 0010 | 0000 | A6B5 | 1E27 |
| 0020 | 0000 | 49AB | 21F9 |
| 0040 | 0000 | 9356 | 43F2 |
| 0080 | 0000 | 226D | 9A53 |
| 0100 | 0000 | 44DB | 34A6 |
| 0200 | 0000 | 89B6 | 694C |
| 0400 | 0000 | 17AD | CF2F |
| 0800 | 0000 | 2F5B | 9E5E |
| 1000 | 0000 | 5EB7 | 3CBC |
| 2000 | 0000 | BD6E | 7978 |
| 4000 | 0000 | 7E1D | EF47 |
| 8000 | 0000 | FC3B | DE8E |

At the second networking (receiver) device, the same operation is performed to calculate CRCV4, but using the CRCV3 calculated from the descrambler state immediately after the last bit of T(x) is descrambled as the input. The i-bit sequence CRCV4 is then added modulo 2 to the FCS field 410 and to the bits $x^{43+i-1}$ to $x^{43}$ T(x) after descrambling.

If there are no transmission errors, the above operation at the second networking device restores the transmitted message T(x) to its original bit sequence, since the scrambler and descrambler states will be identical after the last bit of the transmitted message is scrambled/descrambled. Note that i-bit sequence CRCV4 is also added to the FCS field 410 at the second networking device because of the duplication effect the descrambler has on the CRCV4 that was added after scrambling at the first networking device.

If there are transmission errors, the received message after descrambling (and after CRCV4 is added to the indicated fields) can be written as the following:

$$N(x)=T(x)+J_1(x)(x^{43}+1)+\tilde{D}(x)+J_r(x)(x^{43}+1), \text{ where} \quad (5)$$

"T(x)" is the original message received for transmission at the physical layer of the first networking device (transmitter), "$J_i(x)$" is the polynomial representation of the i-bit sequence CRCV4 that is added to the bits $x^{43+i-1}$ to $x^{43}$ of T(x) at the transmitter after scrambling (the term "$x^{43}+1$" accounts for duplication of $J_i(x)$ by the descrambler at the second networking device), $\tilde{D}(x)=E(x)+E_i(x)$ is the error message after descrambling ($E'_i(x)$ is the part of the duplication of E(x) that is inside T(x)), and "$J_r(x)$" is the polynomial representation of the i-bit sequence CRCV4 that is added to the bits $x^{43+i-1}$ to $x^{43}$ and to the FCS field at the second networking device (receiver) after descrambling (the term "$x^{43}+1$" accounts for the two additions of CRCV4 that occur 43 bits from each other).

Until now, we have assumed that all of these message polynomials are expressed having their $x^o$ terms coinciding with the rightmost bit of T(x). However, in order to express the part of the error E(x) that is duplicated outside T(x), we will have to express all of these message polynomials with their $x^o$ terms coinciding with the rightmost bit of $T(x)x^{43}$. To indicate a polynomial that is expressed using this new reference, we use dots ( . . . ) on top of the polynomial identifier. Thus, equation (5) can be rewritten as $$\ddot{N}(x)=\ddot{T}(x)+\ddot{J}_i(x)(x^{43}+1)+\ddot{D}(x)+\ddot{J}_r(x)(x^{43}+1), \text{ where} \quad (6)$$

$\ddot{N}(x)=N(x)x^{43}$; $\ddot{T}(x)=T(x)x^{43}$; $\ddot{J}(x)=J_i(x)x^{43}$; $\ddot{D}(x)=\tilde{D}(x)x^{43}$, and $\ddot{J}_r(x)=J_r(x)x^{43}$.

Also that $\ddot{E}(x)=E(x)x^{43}$; $\ddot{E}_i'(x)=E_i'(x)x^{43}$.

Since $\ddot{J}_r(x)=\ddot{J}_i(x)+R\_CRC[CRC[\ddot{E}'_o(x)]]x^{43}$, $$\ddot{N}(x)=\ddot{T}(x)+\ddot{D}(x)+R\_CRC[CRC[\ddot{E}'_o(x)]]x^{43}(x^{43}+1) \quad (7)$$

But since CRC[T(x)]=0, and $CRC[R\_CRC[CRC[\ddot{E}'_o(x)]]x^{43}(x^{43}+1)]=CRC[\ddot{E}'_o(x)]$, then, $CRC[\ddot{N}(x)]=CRC[\ddot{D}(x)]+CRC[\ddot{E}'_o(x)]$ $=CRC[\ddot{D}(x)+\ddot{E}'_o(x)]$ $=CRC[\ddot{E}(x)+\ddot{E}'_i(x)+\ddot{E}'_o(x)]$ $=CRC[\ddot{E}(x)+\ddot{E}'(x)]$ $=CRC[\tilde{D}(x)]$, where $\tilde{D}(x)=\ddot{E}(x)+\ddot{E}'(x)$ is the complete error message with error duplication and $\ddot{E}'(x)$ is the polynomial representation of the duplication of $\ddot{E}(x)$. Since $\ddot{N}'(x)=N(x)x^{43}$, $CRC[\ddot{N}(x)]=0$ if and only if CRC[N(x)]=0. Thus, the proposed technique makes all detectable errors on the medium detectable by a high layer that checks the CRC of the received message.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A networking device comprising logic employed within a physical layer of the device to modify an original cyclic redundancy check (CRC) value associated with a message and enable detection of a duplication of bit errors at a targeted destination of the message, the logic comprises a scrambler that comprises (1) a CRC engine to calculate a value based on a bit sequence including a state of the scrambler prior to scrambling a body of the message and a plurality of zero bits equal in number to a bit size of the message, and (2) an adder to perform modulo 2 addition on the value and the original CRC value of the message to produce a modified CRC value.

2. The networking device of claim 1, wherein the duplication of bit errors is caused by bit errors occurring a predetermined number of bits before a beginning of the message.

3. The networking device of claim 1 further comprising a data link layer in communication with the physical layer.

4. The networking device of claim 3, wherein the modification of the CRC value is transparent to the data link layer.

5. The networking device of claim 4, wherein a format of the transmitted message remains unmodified even after modification of the CRC value.

6. A networking device comprising logic employed within a physical layer of the device to modify an original cyclic redundancy check (CRC) value associated with a message and enable detection of a duplication of bit errors at a targeted destination of the message, the logic is a $x^N+1$ scrambler, where N being a positive whole number, including
- a CRC engine to calculate a resulting CRC value based on a bit sequence including a state of the $x^N+1$ scrambler after a last bit of a body of the message has been scrambled;
- a table to produce an inverse value to the resulting CRC value;
- an adder to perform modulo 2 addition on the inverse value and a bit pattern from a selected portion of the message having a least significant bit N bits away from a least significant bit of the message.

7. The networking device of claim 6, wherein the duplication of bit errors is caused by bit errors occurring a predetermined number of bits after an ending of the message.

8. A networking device comprising:
- a data link layer; and
- a physical layer including a descrambler to perform operations on a message transparent to the data link layer to enable the data link layer to detect a duplication of bit errors caused by scrambling of information within a body of the message prior to receipt of the message, the descrambler includes
  - a CRC engine to calculate a value based on a bit sequence including a state of the descrambler prior to descrambling of the body of the message and a plurality of zero bits equal in number to a bit size of the message, and
  - an adder to perform modulo 2 addition on the value and a modified CRC value contained in the message to produce an original CRC value of the message.

9. The networking device of claim 8, wherein a format of the received message remains intact even after descrambling the body of the message.

10. The networking device of claim 8, wherein the duplication of bit errors is caused by bit errors occurring a predetermined number of bits before a beginning of the message.

11. A networking device comprising:
- a data link layer; and
- a physical layer including a descrambler to perform operations on a message transparent to the data link layer to enable the data link layer to detect a duplication of bit errors caused by scrambling of information within a body of the message prior to receipt of the message, the descrambler is a $x^N+1$ descrambler, where N being a positive whole number, that comprises
  - a CRC engine to calculate a resulting CRC value based on a bit sequence including a state of the $x^N+1$ scrambler after a last bit of a body of the message has been descrambled;
  - a table to produce an inverse value to the resulting CRC value;
  - a first adder to perform modulo 2 addition on the inverse value and a bit pattern from a selected portion of the message having a least significant bit N bits way from a least significant bit of the message; and
  - a second adder to perform modulo 2 addition on the inverse value and a modified CRC value contained in the message.

12. The networking device of claim 11, wherein the duplication of bit errors is caused by bit errors occurring a predetermined number of bits after an ending of the message.

13. The networking device of claim 12, wherein the descrambler is a $x^N+1$ descrambler, where N being a positive whole number.

14. A network comprising:
- a first networking device including a scrambler employed within a physical layer of the first networking device that only modifies an original cyclic redundancy check (CRC) value of a message prior to scrambling of a body of the message before transmission; and
- a second networking device in communication with the first networking device, the second networking device including a descrambler employed within a physical layer of the second networking device to perform descrambling operations on the body of the message and subsequently modifying the CRC value based on a bit sequence including a state of the descrambler just prior to descrambling of the body of the message and a plurality of zero bits equal in number to a bit size of the message.

15. A method comprising:
- loading a bit sequence to act as coefficients of a polynomial into a cyclic redundancy check (CRC) engine, the bit sequence including a state of a scrambler at a moment that a first bit of a transmitted message is to be scrambled and a number of zero bits equal in size to a number of bits contained in the transmitted message;
- calculate a first resulting CRC value; and
- performing arithmetic computations on the first resulting CRC value and an original CRC value to produce a modified CRC value.

16. The method of claim 15, wherein the arithmetic computations includes modulo 2 addition.

17. The method of claim 15, further comprising:
- loading a bit sequence to act as coefficients of a polynomial into a cyclic redundancy check (CRC) engine, the bit sequence including a state of a descrambler at a moment that a first bit of the transmitted message is to be descrambled and a number of zero bits equal in size to a number of bits contained in the transmitted message;
- calculate a second resulting CRC value; and
- performing modulo 2 addition on the second resulting CRC value and the modified CRC value.

18. A program loaded in memory of a networking device for execution therein, the program comprising a scrambler being code to modify an original cyclic redundancy check (CRC) value of a message through modulo 2 addition prior to scrambling of a body of the message before transmission.

19. The program of claim 18 further comprising:
- a descrambler being code to perform descrambling operations on a body of an incoming message and subsequently modifying a CRC value of the message based on a bit sequence including a state of the descrambler just prior to descrambling of the body of the message and a plurality of zero bits equal in number to a bit size of the message.

* * * * *